United States Patent [19]
Hikida

[11] Patent Number: 5,147,818
[45] Date of Patent: Sep. 15, 1992

[54] METHOD FOR MANUFACTURING A BICMOS SEMICONDUCTOR DEVICE HAVING A LATERAL BIPOLAR TRANSISTOR

[75] Inventor: Satoshi Hikida, Nara, Japan

[73] Assignee: Sharp Kabushiki Kaisha, Japan

[21] Appl. No.: 787,404

[22] Filed: Nov. 4, 1991

[30] Foreign Application Priority Data

Nov. 8, 1990 [JP] Japan .................. 2-304837

[51] Int. Cl.[5] .................................. H01L 21/331
[52] U.S. Cl. ........................ 437/57; 437/32; 148/DIG. 9
[58] Field of Search ............... 437/31, 32, 34, 44, 437/57, 153, 154; 148/DIG. 9, DIG. 10, DIG. 11, DIG. 109, DIG. 124

[56] References Cited

U.S. PATENT DOCUMENTS

| | | | |
|---|---|---|---|
| 4,891,328 | 1/1990 | Gris | 437/57 |
| 4,914,048 | 3/1990 | Scovell et al. | 437/34 |
| 4,956,305 | 9/1990 | Arndt | 437/32 |
| 4,965,216 | 10/1990 | Scovell et al. | 437/32 |
| 5,045,493 | 9/1991 | Kameyama et al. | 148/DIG. 9 |

FOREIGN PATENT DOCUMENTS 2188479  9/1987  United Kingdom .......... 437/57

OTHER PUBLICATIONS

CMOS Compatible Lateral Bipolar Transistor for BiCMOS Technology, Akiyama et al, pp; 109-112, 1989.

Primary Examiner—Brian E. Hearn
Assistant Examiner—C. Chaudhari
Attorney, Agent, or Firm—Nixon & Vanderhye

[57]  ABSTRACT

A method for manufacturing a semiconductor device wherein in the case where a Bi transistor and a CMOS transistor are to be formed on a first conductive semiconductor substrate, a gate oxide film on an active base in a Bi transistor formation region is partially removed by a predetermined pattern so as to form the opening of the gate oxide film, a polysilicon layer having second conductive impurities doped at a high density is patterned over the edge of the opening, and the emitter region of the Bi transistor is formed from the portion in which the active base comes into contact with the first conductive semiconductor substrate, i.e., from the gate edge and the edge of the opening of the gate oxide film to the portion in which the gate oxide film comes into contact with a gate, prior to the steps of determining a transistor formation region by an isolation oxide film, thermally oxidizing the whole surface of the semiconductor substrate including the isolation oxide film, injecting first conductive impurities as the active base in the Bi transistor formation region and forming the polysilicon layer having the second conductive impurities doped at the high density at the gate of the CMOS transistor.

9 Claims, 4 Drawing Sheets

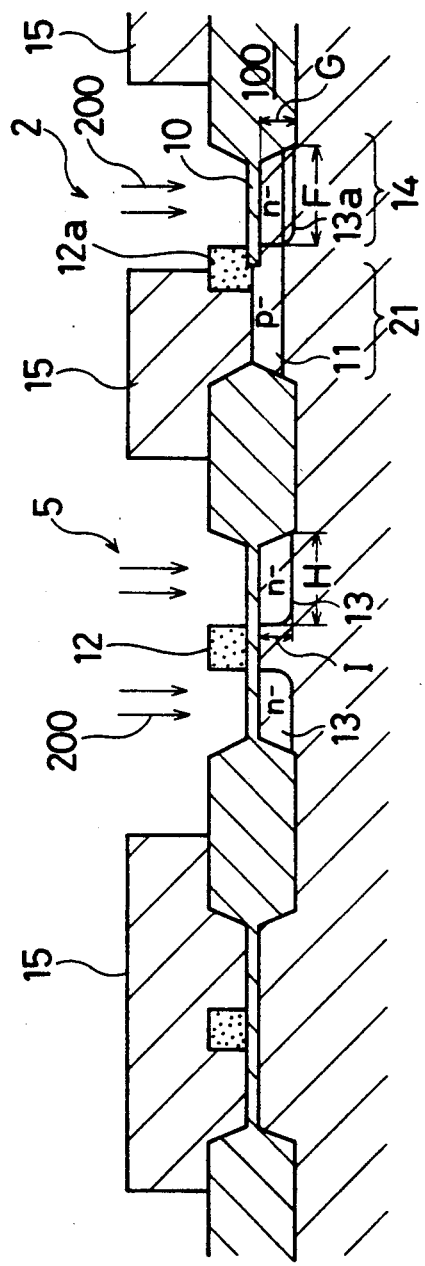
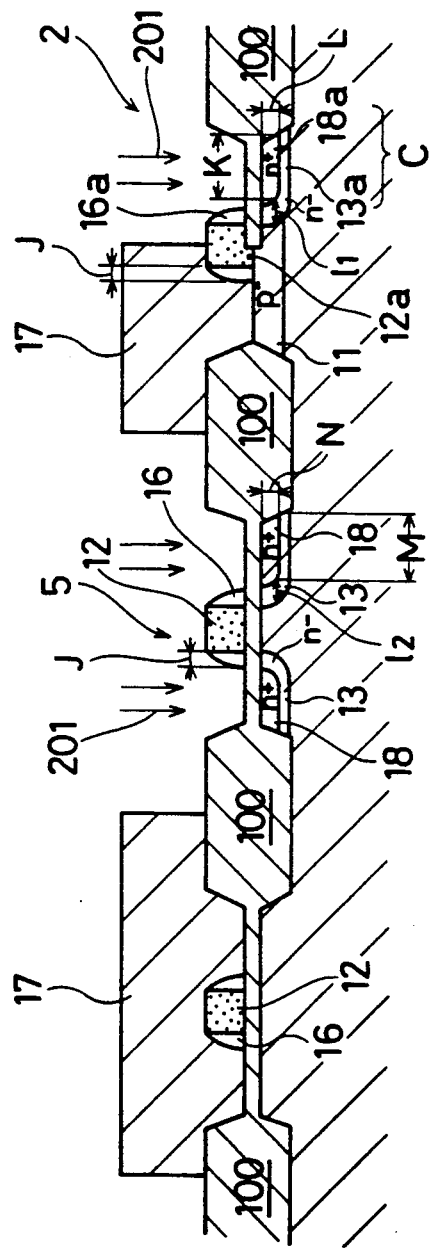
FIG.1(d)
FIG.1(e)

5,147,818

METHOD FOR MANUFACTURING A BICMOS SEMICONDUCTOR DEVICE HAVING A LATERAL BIPOLAR TRANSISTOR

BACKGROUND OF THE INVENTION

1. Field of the Invention

The present invention relates to a method for manufacturing a semiconductor device, and more specifically to a method for manufacturing a so-called BiCMOS transistor (Bipolar Complementary Metal-Oxide Substrate transistor), in particular, a Bipolar transistor (hereinafter referred to as a Bi transistor) in which a cell is comprised of the CMOS transistor and the Bi transistor formed on a single semiconductor substrate.

2. Description of the Prior Art

Conventionally, a BiCMOS transistor is comprised of a CMOS transistor and a so-called lateral type npn-Bi transistor which are simultaneously formed on a single semiconductor substrate, have almost the same dimensions and are formed in almost the same steps. FIG. 3 shows the structure of a lateral type npn-Bi transistor 30. Of course, the CMOS transistor (not shown) is simultaneously formed on a p-type Si substrate on which the Bi transistor 30 is formed.

In FIG. 3, the Bi transistor 30 mainly comprises a gate portion 33, an n+ layer emitter region 34 and an emitter electrode 35, an n+ layer collector electrode pullout region 36 and a collector electrode 37, and a p+ layer base electrode pullout region 38 and a base electrode 39 through a p well 32 on a p-type Si substrate having LOCOS films 31a, 31b and 31c.

Furthermore, when the n-channel MOS transistor formation region (not shown of the CMOS transistor is subjected to n+ doping so as to form the source-drain region of the n-channel MOS transisor, a Bi transistor formation region is simultaneously subjected to n+ doping so as to form the n+ layers 34 and 36.

When the p-channel MOS transistor formation region (not shown) of the CMOS transistor is subjected to p+ doping so as to form the source-drain region of the p-channel MOS transistor, the Bi transistor formation region is simultaneously subjected to p+ doping so as to form the p+ layer 38.

According to a method for forming a Bi transistor mentioned above, however, (i) the emitter region 34 is patterned by a photolithographic technique. An emitter dimension (size) should have an alignment allowance. Consequently, it is difficult to reduce the emitter dimension.

Furthermore, (ii) the emitter region 34 and collector electrode pullout region 36 are formed with the gate portion 33 interposed between the LOCOS films 31a and 31b. The base electrode pullout region 38 is interposed between the LOCOS films 31b and 31c. Consequently, the occupied area of the Bi transistor formation region may be larger than the occupied areas of the channel regions of the CMOS transistor, i.e., those of the n-channel and p-channel MOS transistor formation regions by the area of the base electrode pullout region 38. As a result, the Bi transistor 30 is made larger than the MOS transistor, so that it is hard to reduce a cell size.

It is an object of the present invention to provide a method for manufacturing a semiconductor device wherein an increase in cost is held down to a minimum and the occupied area of a Bi transistor is at least made small and almost the same as that of each MOS transistor so that a cell size can be reduced in the case where the Bi transistor having high performance is to be formed on a semiconductor substrate, on which a CMOS transistor is formed, in almost the same steps so as to have almost the same dimension as that of the CMOS transistor.

SUMMARY OF THE INVENTION

The present invention provides a method for manufacturing a semiconductor device in which a bipolar transistor and a CMOS transistor are formed on a first conductive semiconductor substrate, comprising the steps of (i) determining a bipolar transistor formation region, an n-channel MOS transistor formation region and a p-channel MOS transistor formation region by an isolation oxide film on the first conductive semiconductor substrate, then thermally oxidizing the whole surface of the semiconductor substrate including the isolation oxide film so as to form a gate oxide film over the three regions, and injecting first conductive impurities in the bipolar transistor formation region at a low density so as to form an active base layer, (ii) opening the gate oxide film in the bipolar transistor formation region by a predetermined pattern so as to form a gate oxide film opening on the active base layer, (iii) forming a conductive film for gate formation having second conductive impurities doped at a high density over the semiconductor substrate including the opening, then patterning the conductive film so as to form a gate in the n-channel and p-channel MOS transistor formation regions, and simultaneously forming a gate in the bipolar transistor formation region over a gate oxide film region remaining when forming the opening, and an opening region on the active base layer, (iv) forming a source-drain in the n-channel MOS transistor formation region, and simultaneously forming a collector electrode pullout region in the gate oxide film region remaining on an active base layer surface in the bipolar transistor formation region, (v) forming a source-drain in the p-channel MOS transistor formation region, and simultaneously forming a base electrode pullout region in the opening region on the active base layer surface which is opposed to the collector electrode pullout region with a gate interposed in the bipolar transistor formation region, (vi) laminating a layer insulating film over the semiconductor substrate including the isolation oxide film, gate, collector electrode pullout region and base electrode pullout region, and (vii) carryign out a heat treatment so as to reflow the layer insulating film, and automatically doping the second conductive impurities from the gate to the active base layer in the bipolar transistor formation region by the heat treatment so as to form an emitter region on the active base layer surface just below the gate.

According to the present invention, in the case where the Bi transistor and the CMOS transistor are to be formed on the first conductive semiconductor substrate, the gate oxide film on the active base in the Bi transistor formation region is partially removed by a predetermined pattern so as to form the opening of the gate oxide film, the polysilicon layer having second conductive impurities doped at a high density is patterned over the edge of the opening, and the emitter region of the Bi transistor is formed from the portion in which the active base comes into contact with the semiconductor substrate, i.e., from the gate edge and the edge of the opening of the gate oxide film to the portion in which the gate oxide film comes into contact with the gate, prior to the steps of determining the transistor formation region by the isolation oxide film, thermally oxidizing the whole surface of the semiconductor substrate including the isolation oxide film, injecting first conductive impurities as the active base in the Bi transistor formation region and forming the polysilicon layer having the second conductive impurities doped at the high density as the gate of the CMOS transistor. Thus, the occupied area of the Bi transistor is made almost the same as those of the channel MOS formation regions of the CMOS transistor, so that a cell size can be reduced.

BRIEF DESCRIPTION OF THE DRAWINGS

FIGS. 1(a) to (g) are views showing manufacturing steps according to an embodiment of the present invention;

PREFERRED EMBODIMENT

Figure 1A:
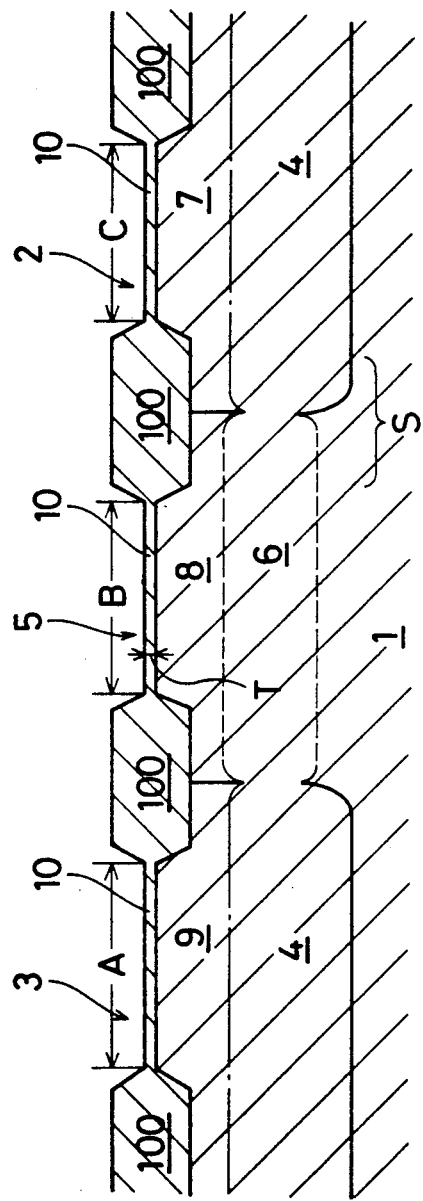
Figure 1B:
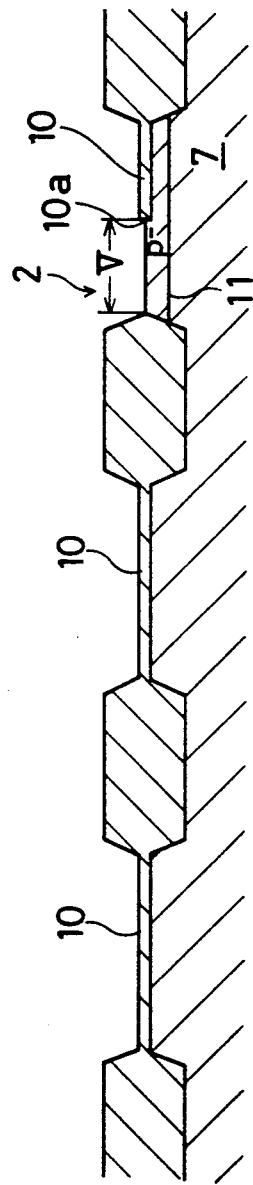

An embodiment of the present invention will be described with reference to FIG. 1. As shown in FIG. 1(a), an n+ buried layer 4 is formed in a Bi transistor formation region 2 and a p-channel MOS transistor formation region 3 on a p-type (1, 0, 0) Si substrate 1. A p+ buried layer 6 is formed over an n-channel MOS transistor formation region 5 and a Bi element isolation region (isolation oxide film) S which surrounds the region 5 on the Si substrate 1. Then, epitaxial layers 7, 8 and 9 are formed at a thickness of about 1.5 μm over the whole surface, respectively.

For the element isolation of the CMOS transistor and the Bi transistor, there are respectively formed as the epitaxial layers an n-type layer 7 just above the n+ buried layer 4 in the region 2, a p well 8 just above the p+ buried layer 6 in the region 5, and an n well 9 just above the n+ buried layer 4 in the region 3. Then, ions are implanted for preventing field inversion in a region, in which a field oxide film is to be formed, on the p well 8 by an ordinary LOCOS method. Thereafter, LOCOS oxidation is carried out to form a field oxide film 100 having a thickness of about 6000 Å. A dummy oxide film is formed at a thickness of about 300 Å. Channel doping is carried out in the n-channel MOS transistor formation region 5 and the p-channel MOS transistor formation region 3 so as to remove the dummy oxide film. A gate oxide film 10 having a thickness T of about 200 Å is formed [see FIG. 1(a)].

In that case, the widths A, B and C of the gate oxide film 10 in the formation regions 3, 5 and 2 are 5 μm, 5 μm and 5 μm, respectively. For the channel doping, p-type B impurities are injected over the formation regions 3 and 5 at a density of $10^{12}$ cm$^{-2}$.

Then, the p-type B impurities are selectively injected only in the Bi transistor formation region 2 at a density of $10^{13}$ cm$^{-2}$ so as to form a p$^-$ layer 11 having a density of $10^{18}$ cm$^{-3}$ on the surface of the n-type expitaxial layer 7 just above the n+ buried layer 4. The p$^-$ layer 11 is the active base layer of an npn-Bi transistor. Thereafter, the gate oxide film 10 in the Bi transistor formation region 2 is partially removed by a predetermined pattern so as to form an opening 10a thereon [see FIG. 1(b)].

In that case, the width V of the opening 10a is set to 2.5 μm.

Subsequently, a polysilicon layer for a gate is deposited at a thickness of about 3500 Å over the Si substrate 1 having the opening 10a. Then, n-type As impurities are injected over the polysilicon layer at a density of $10^{16}$ cm$^{-2}$, and are diffused to form an n+ gate polysilicon layer (not shown). Thereafter, the n+ gate polysilicon layer in the gate formation regions of the n-channel MOS transistor formation region 5 and p-channel MOS transistor formation region 3 is patterned to form a gate 12 therein [see FIG. 1(c)].

Also in the Bi transistor formation region 2, the n+ gate polysilicon layer is patterned to form a gate 12a on the p$^-$ layer 11 including the edge e of the opening 10a of the gate oxide film 10. More specifically, the gate 12a having the n-type As impurities injected at a density of $10^{16}$ cm$^{-2}$ is formed in a region D having a width of 1.0 μm from the p$^-$ layer 11 to the gate oxide film 10 in the vicinity of the edge e therethrough in similar to the gate 12.

In order to form an LDD-type n-channel MOS transistor, P (phosphorous) impurities 200 are injected by using a resist layer 15 so as to form an n$^-$ layer 13 in the region 5 [see FIG. 1(d)].

Also in a region 14 in which the gate oxide film of the Bi transistor region 2 remains, the P impurities 200 are simultaneously injected to form an n$^-$ layer 13a [see FIG. 1(d)]. The n$^-$ layer 13a can be formed by self-aligning with the use of the gate 12a and an isolation oxide film 100 as masks. The n$^-$ layer 13a is the collector region of the Bi transistor. A quantity of the P impurities 200 to be injected is $10^{13}$ cm$^{-2}$. There are formed the n$^-$ layer 13 having a density of $10^{18}$ cm$^{-3}$ and the n$^-$ layer 13a having a density of $10^{17}$ cm$^{-3}$. The width F and depth G of the n$^-$ layer 13a are 2.0 μm and 0.4 μm, respectively. The width H and depth I of the n$^-$ layer 13 are 2.0 μm and 0.4 μm, respectively.

After the resist film 15 is removed, a CVD-SiO$_2$ film (not shown) is deposited at a thickness of about 2000 Å over the Si substrate 1 including the gates 12a and 12. Then, the whole surface of the Si substrate 1 including the SiO$_2$ film is etched by Reactive Ion Etching (RIE) so as to form SiO$_2$ LDD side walls 16a and 16 on the gates 12a and 12 [see FIG. 1(e)].

In that case, the maximum widths J of the LDD side walls 16a and 16 are identical with each other on the gates 12a and 12, and are 0.2 μm.

Then, an n+ layer 18 is formed as a source-drain region on the n$^-$ layer 13 in the n-channel MOS transistor formation region 5 [see FIG. 1(e)].

The n+ layer 18 is formed by self-aligning with the use of a resist film 17, and the isolation oxide film 100 and the side wall 16 of the gate 12 as masks. Then, As (arsenic) impurities 201 are injected at a density of $10^{16}$ cm$^{-2}$. Also in the n$^-$ region 13a of the Bi transistor formation region 2, the As impurities 201 are injected at a density of $10^{16}$ cm$^{-2}$. Consequently, an n+ layer 18a is formed [see FIG. 1(e)].

The n+ layer 18a is also formed by self-aligning with the use of the resist film 17, and the isolation oxide film 100 and the side wall 16a of the gate 12a as masks. The width K and depth L of the n+ layer 18a are 1.8 μm and 0.2 μm, respectively. The width M and depth N of the n+ layer 18 are 1.8 μm and 0.2 μm, respectively. The density of the n+ layer 18a is $10^{21}$ cm$^{-3}$. The density of the n+ layer 18 is $10^{21}$ cm$^{-3}$. The region having the n+ layer 18a is the collector electrode pullout region (collector electrode region) C of the Bi transistor. The n+ layer 18a can be formed by self-aligning with the use of the isolation oxide film 100 and the LDD side wall 16a of the gate 12a as masks. The n+ layer 18 in the n-channel MOS transistor formation region 5 can also be formed by self-aligning with the use of the isolation oxide film 100 and the LDD side wall 16 of the gate 12 as masks. As a result, the n− region 13a and n+ region 18a have an offset $l_1$ which has a length corresponding to the thickness J of the LDD side wall 16a. The n− region 13 and n+ region 18 have an offset $l_2$ which has a length corresponding to the thickness J of the LDD side wall 16 [see FIG. 1(e)]. The offsets $l_1$ and $l_2$ are 0.2 μm and 0.2 μm, respectively. Then, the resist film 17 is removed.

Subsequently, a p+ layer 19 is formed as a source-drain region in the p-channel MOS transistor formation region 3 [see FIG. 1(f)].

In that case, the p+ layer 19 is formed by self-aligning with the use of a resist film 20, and the isolation oxide film 100 and the side wall 16 of the gate 12 as masks. BF$_2$ (boron difluoride) impurities 202 are injected at a density of $10^{15}$ cm$^{-2}$ so as to form the p+ layer 19 having a density of $10^{20}$ cm$^{-3}$.

Simultaneously with the formation of the p+ layer 19, the BF$_2$ impurities 202 are injected at a density of $10^{15}$ cm$^{-2}$ so as to form a p+ layer 19a having a density of $10^{20}$ cm$^{-3}$ also in a region 21 in which the gate oxide film of the Bi transistor formation region 2 is removed [see FIG. 1(d)]. The region having the p+ layer 19a is the base electrode pullout region B of the Bi transistor [see FIG. 1(f)]. The p+ layer 19a can be formed by self-aligning with the use of the isolation oxide film 100 and the LDD side wall 16a of the gate 12a as masks. The width P and depth Q of the p+ layer 19a are 1.8 μm and 0.3 μm, respectively. The width R and depth S of the p+ layer 19 are 1.8 μm and 0.3 μm, respectively.

After the resist film 20 is removed, an NSG film 22 having a thickness of 0.15 μm as a SiO$_2$ film, in which the impurities are not doped, and a BPSG film 23 having a thickness of 0.6 μm as a SiO$_2$ film, in which the B and P impurities are doped, are consecutively deposited by a known method (not shown) over the Si substrate 1 including the gates 12a and 12. Then, the NSG film 22 and BPSG film 23 are reflowed at a predetermined temperature (for example, 900° C.). The As impurities are automatically doped by the above-mentioned heat treatment from the gate 12a to the p− layer 11 in the Bi transistor formation region 2. Consequently, an n+ layer 42 is formed in the p− layer 11 over the bottom of the gate 12a and that of the gate oxide film 10 in the vicinity of the edge e [see FIG. 1(g)]. The region having the n+ layer 42 is the emitter region E of the Bi transistor. The width X and depth Y of the n+ layer 42 are 0.5 μm and 0.2 μm, respectively [see FIG. 2]. According to the present embodiment, the emitter dimension X of the emitter region 42 can be determined by the overlap of two patterns, i.e., the overlap of the opening 10a having the width V and the gate 12a provided in the region D. Consequently, it is possible to set the emitter dimension X which is smaller than a patterning limit. Since the conventional emitter dimension a is 1.0 μm, the emitter dimension X of the n+ layer 42 is shorter by about 0.5 μm in the present embodiment. In addition, the emitter region 42 can be formed just below the gate 12a.

Figure 1C:
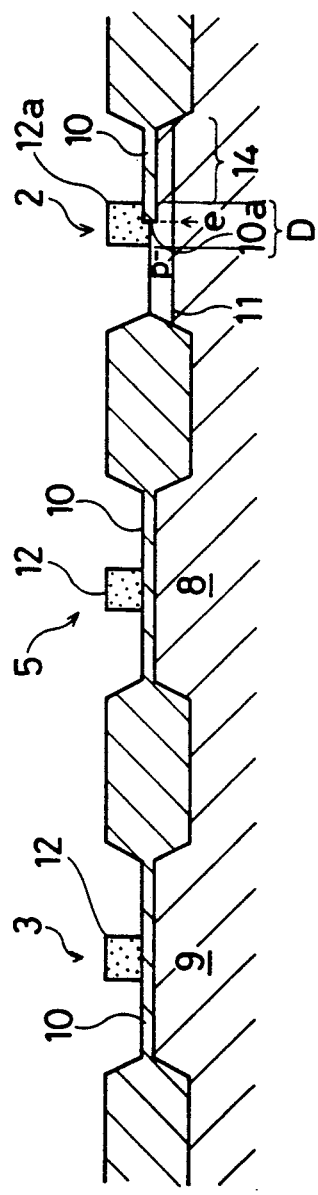
Figure 1F:
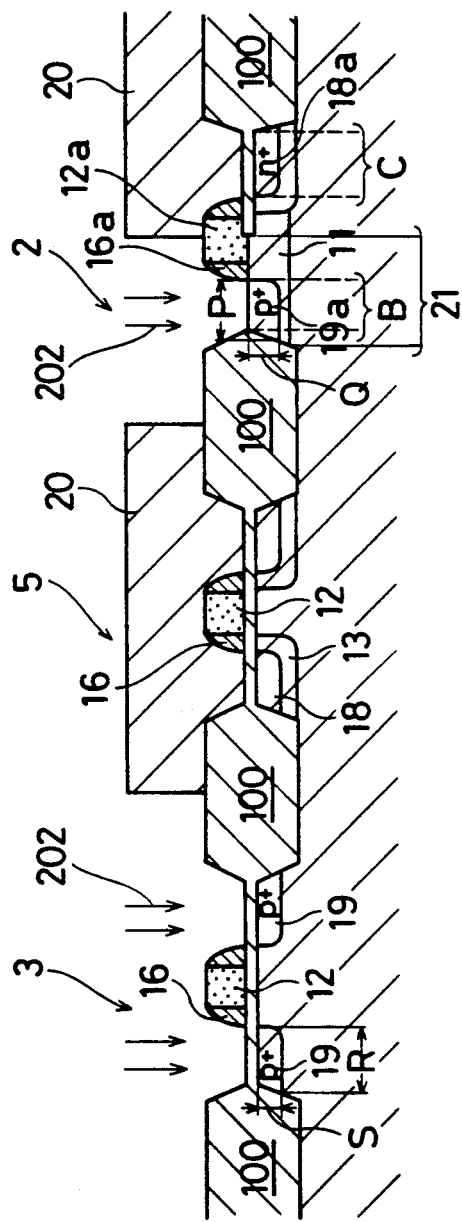

As described above, the n-type As impurities are injected in the n+ polysilicon gate 12a at a density of $10^{16}$ cm$^{-2}$ [see FIG. 1(c)]. Consequently, the n-type As impurities are automatically doped in the p− layer 11 by a heat treatment so that the p+ layer 19a having a density of $10^{21}$ cm$^{-3}$ can be formed. The heat treatment is carried out to reflow a layer insulating film comprised of the NSG film 22 and the BPSG film 23 as described above. In the present embodiment, the above-mentioned heat treatment is utilized. It is necessary to set the temperature of the heat treatment to, for example, 900° C. such that the n-type As impurities are not automatically doped from the gate 12 to the p well 8 and n well 9 through the gate oxide film 10 in the n-channel MOS transistor formation region 5 and p-channel MOS transistor formation region 3. In the present embodiment, when the thickness T of the gate oxide film 10 is about 200 Å and a quantity of the impurities to be injected in the n+ polysilicon gate 12a is $10^{16}$ cm$^{-2}$, the n+ layer 42 having a density of $10^{21}$ cm$^{-3}$ can be formed in the p− layer 11 having a density of $10^{18}$ cm$^{-3}$ by setting to 900° C. the temperature of the heat treatment for reflowing the NSG film 22 having a thickness of 0.15 μm and the BPSG film 23 having a thickness of 0.6 μm.

Subsequently, contact holes 24, 25, 26 and 27 are provided in the regions 3, 5 and 2 of the layer insulating film formed by laminating the BPSG film 23 on the NSG film 22. Metal electrodes 28, 29, 43 and 44 are formed on the contact holes 24, 25, 26 and 27 [see FIG. 1(g)]. The above-mentioned contact holes and electrodes can be obtained by a known method.

In that case, the contact holes 24, 25 and 27 are formed so as to communicate with the p+ layer 19, n+ layer 18 and n+ layer 18a through the NSG film 22, BPSG film 23 and gate oxide film 10. The contact hole 26 is formed so as to communicate with the p+ layer 19a through the NSG film 22 and BPSG film 23, because the gate oxide film 10 has already been removed when the p− layer 11 is formed. The contact holes may be formed by using a predetermined pattern (not shown) simultaneously or several times.

Thus, a BiCMOS transistor is formed.

Figure 1G:
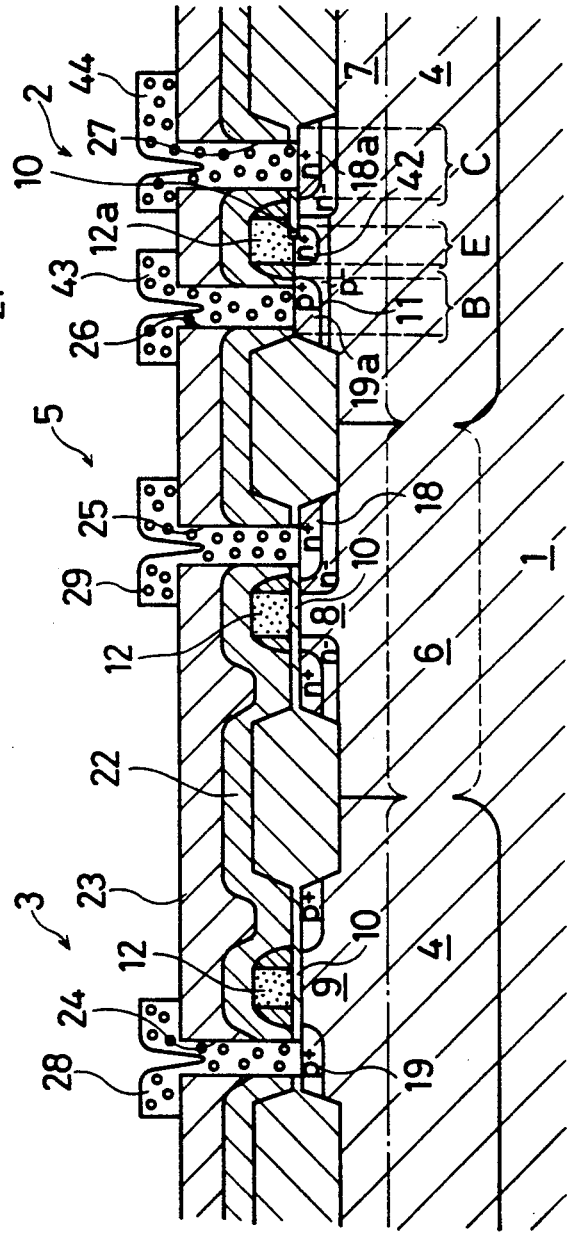
Figure 2:
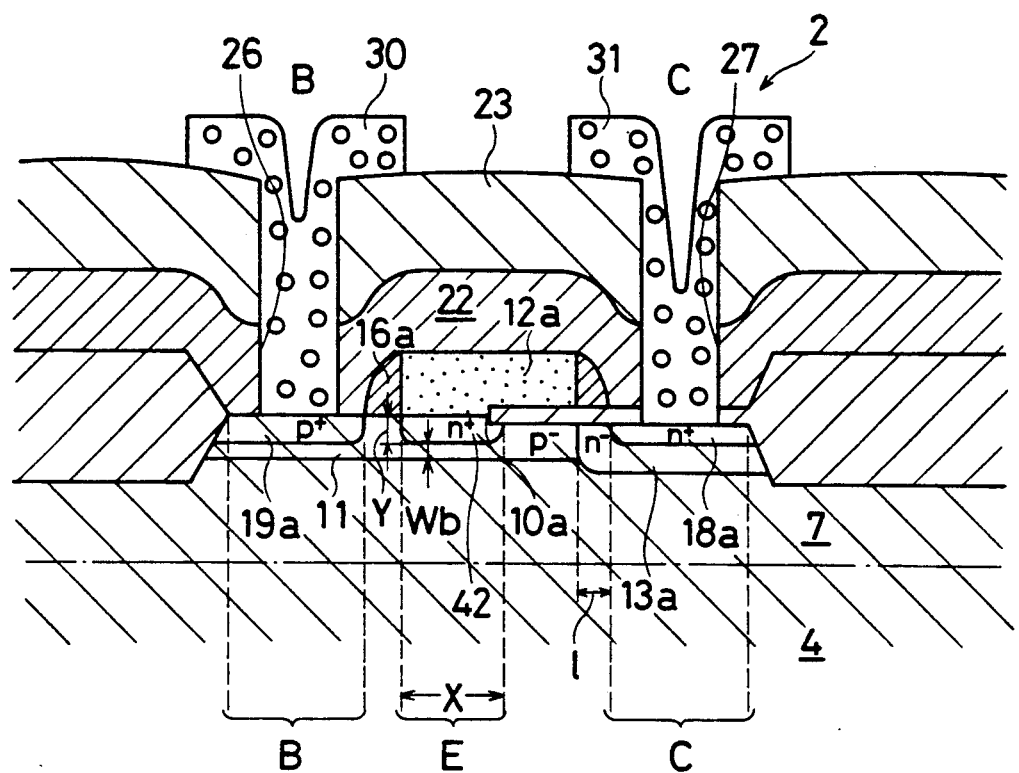
FIG. 2 is a view for explaining the structure of a main part according to the embodiment of the present invention.
Figure 3:
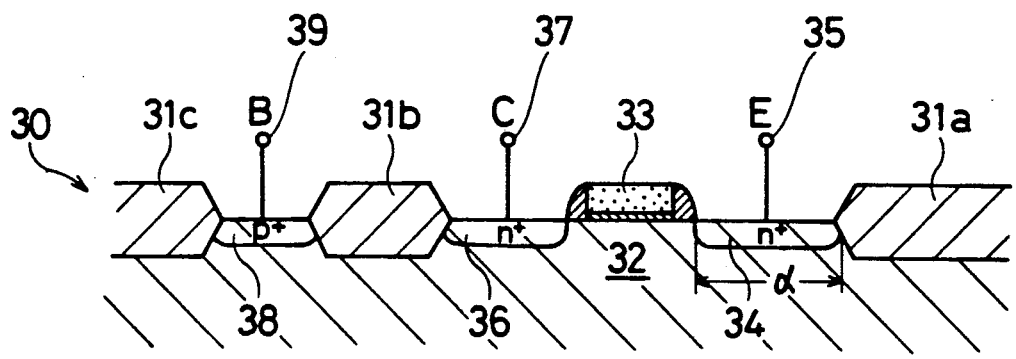
FIG. 3 is a view for explaining the structure of a main part according to the prior art.

FIG. 2 shows the enlarged Bi transistor formation region 2 in FIG. 1(g).

The BiCMOS transistor of the present invention is not limited to the above-mentioned embodiment. In FIG. 1(e), for example, a mask is added to the resist film 17 so as to form a deep n+ collector diffused layer, the P− doping of the active base layer also serves as the channel doping of the MOS transistor formation regions 3 and 5, and the p well 8, n well 9 and n-type epitaxial layer 7 are not needed. In other words, the range of various combinations and omissions, which are not directly concerned with the invention, is very wide. While the npn-Bi transistor is shown in the above-mentioned embodiment, the relationship between the impurities can be reversed to easily form a pnp-Bi transistor.

According to the method for manufacturing a BiCMOS transistor of the present invention, a Bi transistor having fineness and high performance can occupy a smaller area so as to coexist with a CMOS transistor. Consequently, a cell size can be reduced. In addition, there is very small an increase in cost by BiCMOS. According to the method for forming an emitter of the present invention, furthermore, it is possible to form an emitter region which is not greater than a photoprocessing limit. Thus, CMOS can be made finer in future.

What is claimed is:

1. A method for manufacturing a semiconductor device in which a bipolar transistor and a CMOS transistor are formed on a first conductive semiconductor substrate, comprising the steps of;

(i) determining a bipolar transistor formation region, an n-channel MOS transistor formation region and a p-channel MOS transistor formation region by an isolation oxide film on the first conductive semiconductor substrate, then thermally oxidizing the whole surface of the semiconductor substrate including the isolation oxide film so as to form a gate oxide film over the three regions, and injecting first conductive impurities in the bipolar transistor formation region at a low density so as to form an active base layer, (ii) opening the gate oxide film in the bipolar transistor formation region by a predetermined pattern so as to form a gate oxide film opening on the active base layer, (iii) forming a conductive film for gate formation having second conductive impurities doped at a high density over the semiconductor substrate including the opening, then patterning the conductive film so as to form a gate in the n-channel and p-channel MOS transistor formation regions, and simultaneously forming a gate in the bipolar transistor formation region over a gate oxide film region remaining when forming the opening, and an opening region on the active base layer, (iv) forming a source-drain in the n-channel MOS transistor formation region, and simultaneously forming a collector electrode pullout region in the gate oxide film region remaining on an active base layer surface in the bipolar transistor formation region, (v) forming a source-drain in the p-channel MOS transistor formation region, and simultaneously forming a base electrode pullout region in the opening region on the active base layer surface which is opposed to the collector electrode pullout region with a gate interposed in the bipolar transistor formation region, (vi) laminating a layer insulating film over the semiconductor substrate including the isolation oxide film, gate, collector electrode pullout region and base electrode pullout region, and (vii) carrying out a heat treatment so as to reflow the layer insulating film, and automatically doping the second conductive impurities from the gate to the active base layer in the bipolar transistor formation region by the heat treatment so as to form an emitter region on the active base layer surface just below the gate.

2. A method for manufacturing a semiconductor device according to claim 1, wherein the second conductive impurities are injected at a low density so as to form the collector region in the gate oxide film region remaining on the active base layer surface by self-aligning with the use of the isolation oxide film and the gate in the bipolar transistor formation region as masks, the side wall of the gate is formed, the second conductive impurities are injected at a high density so as to form the collector electrode pullout region in the gate oxide film region remaining on the active base layer surface by self-aligning with the use of the side wall and the isolation oxide film as masks, and the source-drain of the n-channel MOS transistor is formed by self-aligning with the use of the isolation oxide film and the gate in the n-channel MOS transistor formation region as masks simultaneously with the injection of the second conductive impurities at the high density.

3. A method for manufacturing a semiconductor device according to claim 1, wherein the side wall of the gate is formed in the bipolar transistor formation region, the first conductive impurities are injected at a high density so as to form the base electrode pullout region in the gate oxide film opening region on the active base layer surface, which is opposed to the collector region of the bipolar transistor formation region with the gate interposed, by self-aligning with the use of the side wall and the isolation oxide film as masks, and the source-drain of the p-channel MOS transistor is formed by self-aligning with the use of the isolation oxide film and the gate in the p-channel MOS transistor formation region as masks simultaneously with the injection of the second conductive impurities at the high density.

4. A method for manufacturing a semiconductor device according to claim 1, wherein the width of the emitter region is set to 20 to 70% of that of the gate in the bipolar transistor formation region.

5. A method for manufacturing a semiconductor device according to claim 2, wherein the collector region is formed by injecting the second conductive impurities at a low density, and the low density impurity layer of the n-channel MOS transistor is simultaneously formed around the gate by self-aligning with the use of the isolation oxide film and the gate in the n-channel MOS transistor formation region as masks.

6. A method for manufacturing a semiconductor device according to claim 5, wherein the collector electrode pullout region is formed in the collector region, and the source-drain of the n-channel MOS transistor is simultaneously formed in the low density impurity layer of the n-channel MOS transistor.

7. A method for manufacturing a semiconductor device according to claim 1, wherein a quantity of the second conductive impurities contained in the conductive film for gate formation is sufficient to form the emitter region on the active base layer surface just below the gate in the bipolar transistor formation region owing to automatic doping.

8. A method for manufacturing a semiconductor device according to claim 1, wherein the conductive film for gate formation is a polysilicon film.

9. A method for manufacturing a semiconductor device according to claim 1, wherein the first conductive impurities are p-type impurities and the second conductive impurities are n-type impurities.

* * * * *